(12) United States Patent
Huang et al.

(10) Patent No.: US 9,146,809 B2
(45) Date of Patent: Sep. 29, 2015

(54) ECC METHOD FOR DOUBLE PATTERN FLASH MEMORY

(71) Applicant: Macronix International Co., Ltd., Hsinchu (TW)

(72) Inventors: Shih-Chang Huang, Magong (TW); Ken-Hui Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 82 days.

(21) Appl. No.: 14/047,418

(22) Filed: Oct. 7, 2013

(65) Prior Publication Data

US 2015/0100852 A1    Apr. 9, 2015

(51) Int. Cl.
*G06F 11/10* (2006.01)
*G11C 29/52* (2006.01)

(52) U.S. Cl.
CPC ............ *G06F 11/1068* (2013.01); *G11C 29/52* (2013.01)

(58) Field of Classification Search
CPC .................................................... G06F 11/1068
USPC .................................. 714/773, 763, 754, 752
See application file for complete search history.

(56) References Cited

U.S. PATENT DOCUMENTS

| | | | | |
|---|---|---|---|---|
| 4,005,405 A * | 1/1977 | West | ............................. | 714/765 |
| 6,526,537 B2 * | 2/2003 | Kishino | ........................ | 714/763 |
| 7,051,260 B2 * | 5/2006 | Ito et al. | ........................ | 714/754 |
| 7,196,644 B1 * | 3/2007 | Anderson et al. | ............. | 341/118 |
| 2004/0083334 A1 * | 4/2004 | Chang et al. | .................. | 711/103 |
| 2011/0283054 A1 | 11/2011 | Kozakai et al. | | |

* cited by examiner

*Primary Examiner* — Fritz Alphonse
(74) *Attorney, Agent, or Firm* — Yiding Wu; Haynes Beffel & Wolfeld LLP

(57) ABSTRACT

A method of operating a memory device storing ECCs for corresponding data is provided. The method includes writing an extended ECC during a first program operation, the extended ECC including an ECC and an extended bit derived from the ECC. The method includes overwriting the extended ECC with a pre-determined state during a second program operation to indicate the second program operation. The method includes, setting the ECC to an initial ECC state before the first program operation; during the first program operation, computing the ECC, changing the ECC to the initial ECC state if the computed ECC equals the pre-determined state; and changing the extended bit to an initial value if the ECC equals the initial ECC state. The method includes reading an extended ECC including an extended bit and an ECC for corresponding data, and determining whether to enable ECC logic using the extended ECC.

20 Claims, 7 Drawing Sheets

| xtECC[7:0] | xtECC[8] | Data Failure | xtECC[7:0] Failure | xtECC[8] Failure | |
|---|---|---|---|---|---|
| Initial Case | 00000000 | 0 | 401 | 405 | 403 | ← 510 |
| Special Case | 00000000 | 1 | 403 | 402 | 401 | ← 520 |
| Second Program | 11111111 | 1 | 404 | 402 | 402 | ← 530 |
| 8 Single-One Cases | 10000000-00000001 | 0 | 405 | 401, 402 | 402 | ← 540 |
| Other Cases | 00001111 | 1 | 405 | 402 | 402 | ← 550 |

FIG. 5

ECC METHOD FOR DOUBLE PATTERN FLASH MEMORY

BACKGROUND OF THE INVENTION

1. Field of the Invention

The present invention relates to memory devices and systems including error correction code (ECC) logic.

2. Description of Related Art

Memory technologies used for integrated circuit memories are being developed at smaller and smaller technology nodes, and are being deployed on larger and larger memory arrays on a single integrated circuit. As the technology for memory cells advances, the margins for sensing the data can become tighter. Also, the ability of the memory cells to hold data values in the presence of disturbance of the memory cell state caused by high speed and high volume accesses to the memory cells and to neighboring memory cells can be limited by the tighter margins.

To address issues like those that arise from tighter margins and memory cell disturbance, as these technologies scale in size and density, use of error correcting codes (ECCs) embedded with integrated circuit memory has become more widespread.

Flash memory is usually configured so that it can be erased a block at a time by a block erase. When a block is erased, memory cells in the block are set to one logic value, such as 0. After a block is erased, memory cells in the block can be programmed to a different value, such as 1. Once a memory cell is programmed to 1, the memory cell can be changed back to 0 by a block erase of the block including the programmed memory cell. Once some memory cells in a block, such as cells in a selected byte or word in the block, are programmed to 1 during a first program operation, other memory cells in a different byte or word in the same block that are known to be in the erased state, can still be programmed to 1 during a second program operation without requiring a pre-erase of the block. A block erase, followed by a first program operation and the second program operation to different locations in the same block can be referred to as double patterning for the purpose of this description. Of course, the block erase operations could be followed by many program operations (more than two) when each program operation is directed to a different part of the block to accomplish a "multiple patterning operation."

In a double or multiple patterning operations, an error correction code (ECC) can be computed and programmed at a particular location in the block during the first program operation. However, the ECC cannot be changed safely for the second program operation in a memory that relies on block erase. The ECC cannot be safely changed in the second program operation because a re-computed ECC may require changing 1 to 0 for at least one bit in the ECC, and that change could require a block erase that would erase data in the entire block.

It is desirable to provide a solution for reliably controlling utilization of ECC logic for error detection and correction for double patterning and multiple patterning operations.

SUMMARY OF THE INVENTION

A method of operating a memory device storing error correcting codes ECCs for corresponding data is provided. For program operations, the method includes writing an extended ECC during a first program operation, the extended ECC including an ECC and an extended bit derived from the ECC. The method includes overwriting the extended ECC including the extended bit and the ECC with a pre-determined state during a second program operation after the first program operation to indicate the second program operation. The ECC can be computed using Hamming codes, for example. The extended bit can be derived by executing a logical exclusive-NOR function (XNOR) on the ECC. In one embodiment, each bit in the pre-determined state for the extended ECC has a logical high value. The method includes setting the ECC to an initial ECC state before the first program operation. The method includes, during the first program operation, computing the ECC, and changing the ECC to the initial ECC state before the first program operation if the computed ECC equals the pre-determined state. In one embodiment, each bit in the initial ECC state has a logical low value. The method includes, during the first program operation, changing the extended bit to an initial value before the first program operation if the ECC equals the initial ECC state. The initial value can include a logical low value.

For read operations, the method includes reading an extended ECC including an extended bit and an ECC for corresponding data from the memory device, where the extended bit is derived from the ECC. The method includes determining whether to enable ECC logic for error detection and correction on the corresponding data using the extended ECC. The method includes performing a parity check on the extended ECC including the extended bit and the ECC to detect a parity error. The parity check can be performed by executing a logical exclusive-OR function on the extended ECC. The method includes enabling the ECC logic for error detection and correction, if a parity error is detected and the ECC equals an initial ECC state before a first program operation. The method includes disabling the ECC logic for error detection and correction, if a parity error is detected and the ECC equals a value other than the initial ECC state. The method includes changing the ECC to a pre-determined state indicating a second program operation after the first program operation and then enabling the ECC logic for error detection and correction, if no parity error is detected and the ECC equals the initial ECC state. The method includes disabling the ECC logic for error detection and correction, if no parity error is detected and the ECC equals the pre-determined state. The method includes enabling the ECC logic for error detection and correction, if no parity error is detected and the ECC equals a value other than the pre-determined state and other than the initial ECC state.

Other aspects and advantages of the present invention can be seen on review of the drawings, the detailed description and the claims, which follow.

BRIEF DESCRIPTION OF THE DRAWINGS

FIG. 5 is a table illustrating how improved program and read operations respond to failures in data and in extended ECC.

DETAILED DESCRIPTION

A detailed description of embodiments of the present invention is provided with reference to the figures.

Figure 1:
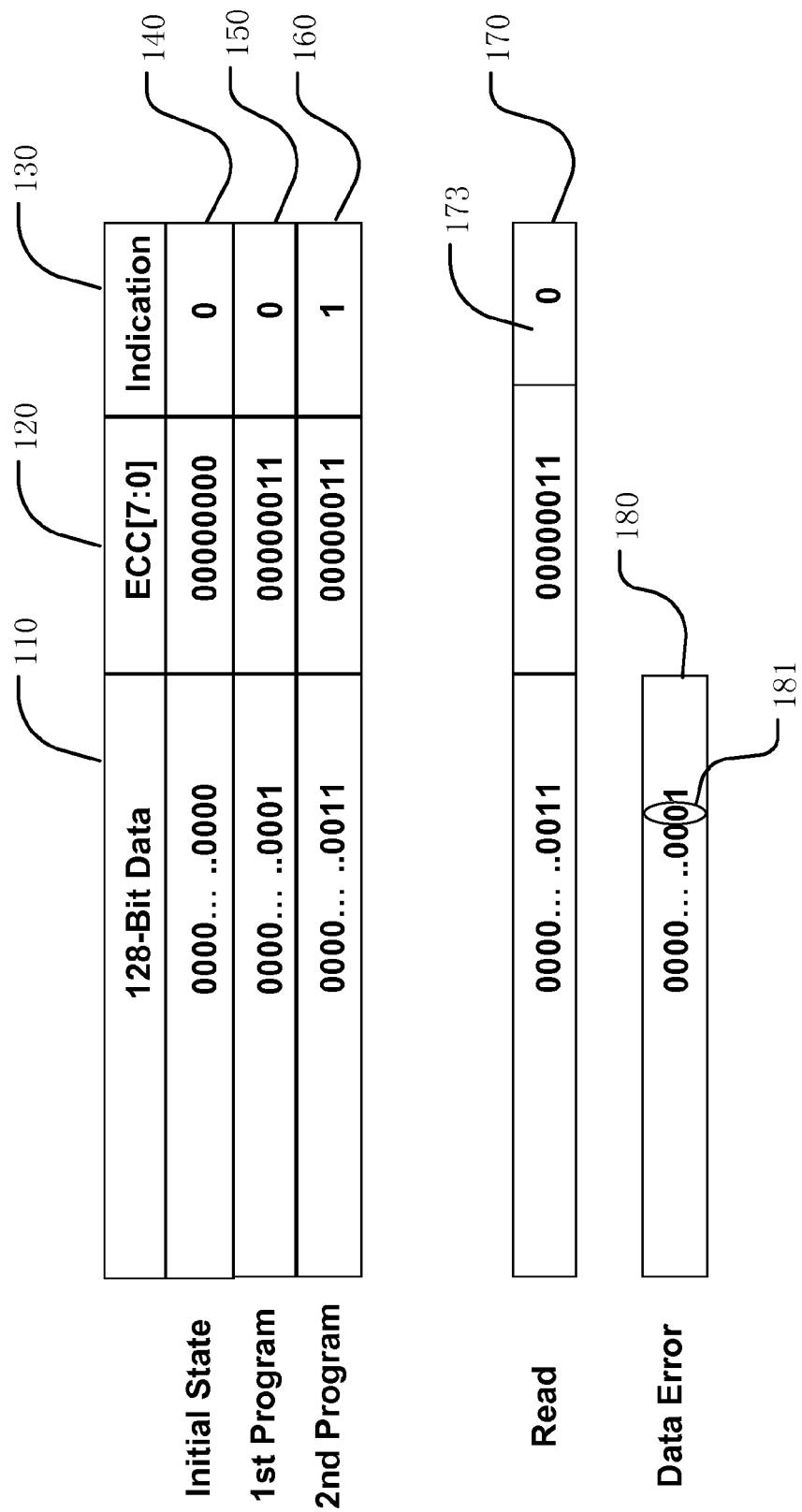
FIG. 1 illustrates a scheme of program and read operations that disable ECC function for a second program operation.

FIG. 1 illustrates a scheme of program and read operations that disable ECC function for a second program operation. An indication bit (prior art) is used to indicate whether ECC logic is executed to detect and correct errors on data during a read operation.

In the example illustrated in FIG. 1, 128-bit data in a page of data is shown in column 110. ECCs for the corresponding 128-bit data are shown in column 120. The indication bit is shown in column 130. The indication bit is assigned a logical value '0' for a first program operation to enable ECC. To enable ECC refers to detecting and correcting errors on the corresponding data using the computed and stored ECC for the page during a read operation. During a second program operation after the first program operation, different data can be programmed into the same page of data sometimes without requiring an erase operation for the page. For example, this could happen when the second program is directed to a part of the page that remained in the erased state after the first program. In the scheme, the indication bit is assigned a logical value '1' for the second program operation to disable ECC. To disable ECC refers to not executing error detection and correction on the corresponding data using the ECC during a read operation. If the second program operation is executed without a pre-erase that also erases the ECC bits, then overwriting the ECC from the first program operation with ECC from the second program operation is not reliable in memory like flash memory. So, in that case, it is important to disable ECC operations for reads of data after the second program operation.

An initial ECC state can result from a block erase of the page of data such that the initial ECC state includes all "0 s". For example, if an ECC includes 8 bits, then after a block erase, the initial ECC state equals "00000000" or erased state values. Data in the page and the indication bit for the page also include all "0s" after a block erase, as shown on row 140. In this example, ECC[7:0] refers to an ECC with 8 bits for corresponding data of 128 bits, although ECCs can have different numbers of bits for corresponding data of different lengths.

For the first program operation, as shown on row 150, data "0000 . . . 0001" is programmed in a page of data, ECC[7:0] has a computed value of '00000011' for the corresponding data, and the indication bit is assigned the value of '0' to enable ECC.

For the second program operation, as shown on row 160, data for the second bit is programmed resulting in "0000 . . . 0011" in the same page of data as programmed by the first program operation, ECC[7:0] keeps the computed value of '00000011' from the first program operation, and the indication bit is assigned the value of '1' to disable ECC. The value of the indication bit is set to indicate the occurrence of the second program operation, and is not derived from the ECC [7:0]. Data "0000 . . . 0011" as a result of the second program operation is different than data "0000 . . . 0001" that results from the first program operation. In a read operation subsequent to the second program operation, the ECC logic is not executed on the data programmed by the second program operation, because the indication bit has the value of '1' to disable ECC.

Row 170 illustrates a condition in which, due to a retention error, the indication bit '1' can be mistakenly inverted to '0' (e.g. 173). In a read operation, the mistaken value of the indication bit would result in enabling ECC, and consequently the ECC logic can be mistakenly executed using an unreliable ECC such that the data might be mistakenly flagged as having an uncorrectable error, or reverted to the data programmed by the first program operation. For example, on row 180, use of the ECC from the first program operation could result in a bit in the data (e.g. 181) is mistakenly changed from '1' as programmed by the second program operation, to '0' as programmed by the first program operation, causing an undetected data error in the read data.

Figure 2:
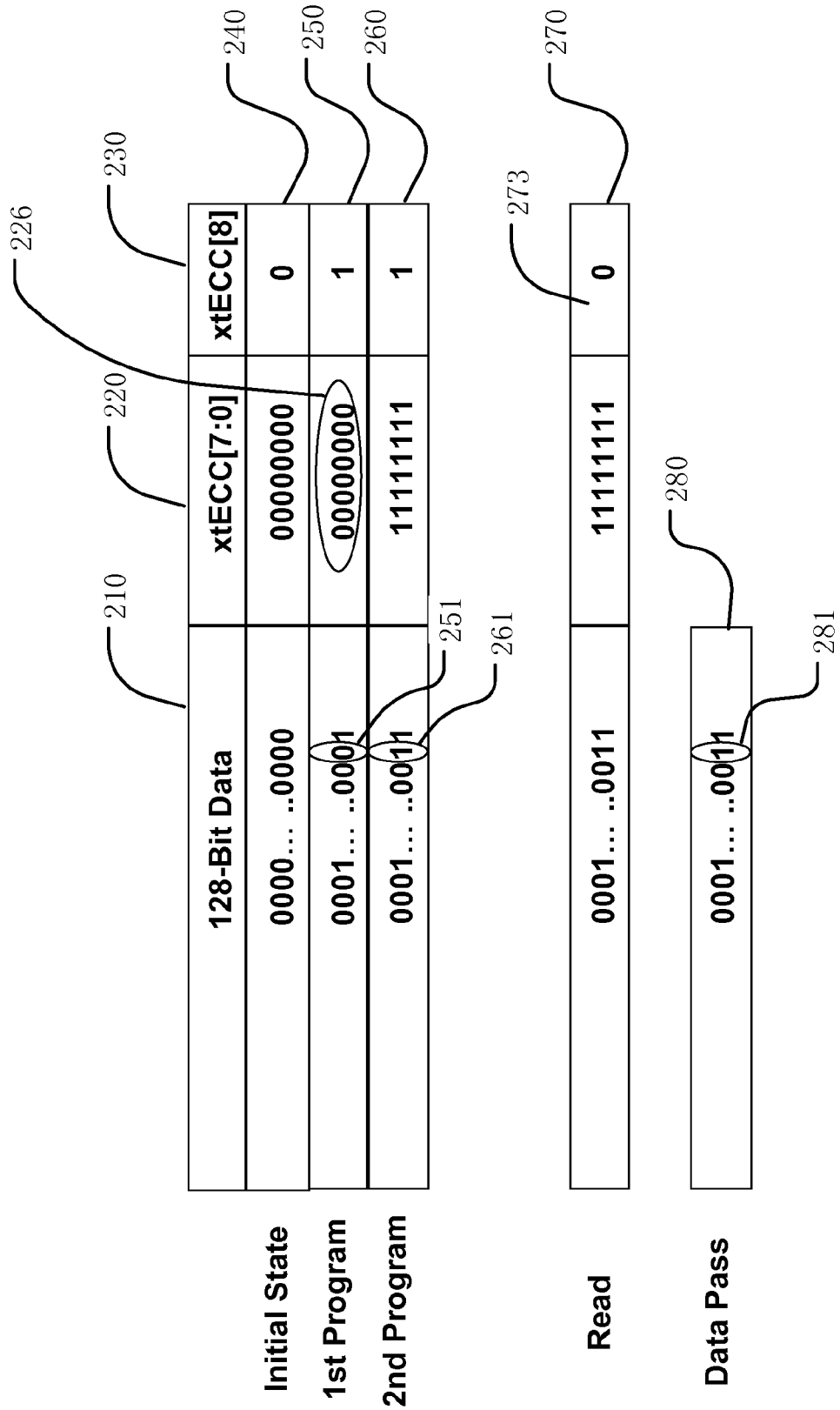
FIG. 2 illustrates improved program and read operations that disable ECC function for a second program operation.

FIG. 2 illustrates improved program and read operations that disable ECC function for a second program operation. An extended ECC (e.g. xtECC[8:0]) includes an ECC (e.g. xtECC[7:0]) and an extended bit (e.g. xtECC[8]) derived from the ECC. The extended bit can be used to indicate whether ECC logic is executed to detect and correct errors on corresponding data with a read operation, where the corresponding data may have been programmed with the first program operation or the second program operation. Also, use of the extended bit as described herein can prevent the occurrence of undetected errors such as described above with reference to row 180 of FIG. 1. In this example, xtECC[7:0] refers to an ECC with 8 bits for corresponding data of 128 bits, although ECCs can have different numbers of bits for corresponding data of different lengths.

The extended bit is derived from the ECC bits, such as by computing an odd parity bit, and added to the ECC for performing an odd parity check. A value of the odd parity bit is determined such that the number of bits with the value one is odd, where the number of bits includes bits in the ECC and the extended bit. For one example, if an ECC has 8 bits, and each of the 8 bits has the value one for a total of 8 ones where 8 is not odd, then the odd parity bit is determined to be one such that there is a total of 9 ones where 9 is odd. For another example, if an ECC has 8 bits, and 3 of the 8 bits has the value one for a total of 3 ones where 3 is odd, then the odd parity bit is determined to be zero such that there is a total of 3 ones where 3 is odd.

To generate the odd parity bit from the ECC, a logical exclusive-NOR (XNOR) function can be used on the ECC, as an XNOR function returns one when an even number of inputs to the XNOR function has the value one. To perform the odd parity check on the ECC and the extended bit, a logical exclusive-OR (XOR) function can be used on the ECC and the extended bit, as an XOR function returns one when an odd number of inputs to the XOR function has the value one, and otherwise returns zero.

In the example illustrated in FIG. 2, 128-bit data in a page of data is shown in column 210. ECCs for the corresponding 128-bit data are shown in column 220. The extended bit xtECC[8] is shown in column 230. In general, during a first program operation, the extended bit is derived as an odd parity bit from the ECC for corresponding data, and during a read operation, error detection and correction are executed if an odd parity check on the ECC and the extended bit shows no parity error, with the exception of an initial case and a special case which are explained herein.

An initial ECC state can result from a block erase of the page of data such that the initial ECC state includes all "0s". For example, if an ECC includes 8 bits, then after a block erase, the initial ECC state equals "00000000" or erased state values. The extended bit xtECC[8] and the data in the page also include all "0s" after a block erase, as shown on row 240. A parity check, as described below, on the ECC and extended bit sees the initial ECC state and the initial value '0' of the extended bit as a parity error. To protect the data when the ECC is at the initial ECC state, this "initial case" is addressed by the program and read operations as described in connection with FIG. 3 and FIG. 4. The ECC and the extended bit are computed for the first program operation. The ECC and the extended bit are overwritten with a pre-determined state for the second program operation. The pre-determined state is not seen by the parity check as a parity error, but as an indication that the data in a page is written with the second program operation so the ECC logic should not be enabled for error detection and correction.

For the first program operation, as shown on row 250, data "0001 ... 0001" is programmed in a page of data. xtECC[7:0] initially has a computed value of '11111111' for the corresponding data, and the extended bit xtECC[8] has an odd parity bit value of '1' derived from the computed ECC value of '11111111' using a logical exclusive-NOR (XNOR) function. The computed ECC value of '11111111' for the first program operation is changed to "00000000" (226) for reasons explained below in connection with the second program operation.

For the second program operation, as shown on row 260, data "0001 ... 0011" is programmed in the same page of data as programmed by the first program operation. Data "0001 ... 0011" programmed by the second program operation is different than data "0001 ... 0001" programmed by the first program operation. In particular, a bit 261 in the data programmed with the second program operation is different than a corresponding bit 251 in the data programmed with the first program operation.

For the second program operation, xtECC[7:0] and the extended bit xtECC[8] are overwritten with a pre-determined state, such as '111111111', to indicate that the data is programmed with the second program operation, and therefore a read operation on the data is to disable ECC, not executing error correction or detection using the ECC on the data.

However, in a special case, a computed value for xtECC [7:0] can include '11111111' and the extended bit xtECC[8] derived from the computed value is '1', coinciding with the pre-determined state to disable ECC. To ensure that the computed value of '11111111' for xtECC[7:0] does not indicate disabling ECC, during the first program operation, the computed ECC value of '11111111' for the first program operation is set to "00000000" (226). As explained herein, a read operation can recognize this special case, change "00000000" to '11111111', and then enable ECC for error detection and correction on the corresponding data.

As shown on row 270, for a read operation on data programmed with the second program operation, due to a retention error, the extended bit xtECC[8] can be mistakenly inverted. If this error occurs, an odd parity check on the ECC and the extended bit xtECC[8] indicates a parity error, preventing the ECC logic from being mistakenly executed. For example, if the xtECC[8] value of '1' on row 260 for the second program operation is changed to '0' on row 270 due to retention error (273), an odd parity check on the ECC with value of '11111111' and the extended bit xtECC[8] with value of '0' indicates a parity error and no change is made to the data programmed with the second program operation. On row 280, a bit 281 as read has the same value as the bit 261 as programmed by the second program operation (assuming there has been no error in bit 261), even though the extended bit xtECC[8] is mistakenly changed, as shown on row 270.

Hexadecimal and binary notations are used in this application. For example, "8'hFF" is a hexadecimal notation of an 8-bit binary number "8'b11111111", where each bit in the binary number has a value of '1'. "8" in "8'hFF" or "8'b11111111" indicates the number of bits. "h" in "8'hFF" indicates hexadecimal, while "b" in "8'b11111111" indicates binary. Digits after "h" in "8'hFF" are hexadecimal digits. Digits after "b" in "8'b11111111" are binary digits. Hexadecimal digits include 16 values: 0, 1, 2, 3, 4, 5, 6, 7, 8, 9, A, B, C, D, E and F, equal to 0000, 0001, 0010, 0011, 0100, 0101, 0110, 0111, 1000, 1001, 1010, 1011, 1100, 1101, 1110, and 1111 in binary, respectively. Thus, "8'hFF", "8'h00", and "9'h1FF" in hexadecimal are equal to "8'b11111111", "8'b00000000", and "9'b111111111" in binary, respectively. For another example, 1'b0 is a binary number including only 1 bit with a value of '0', while 1'b1 is a binary number including only 1 bit with a value of '1'.

Figure 3:
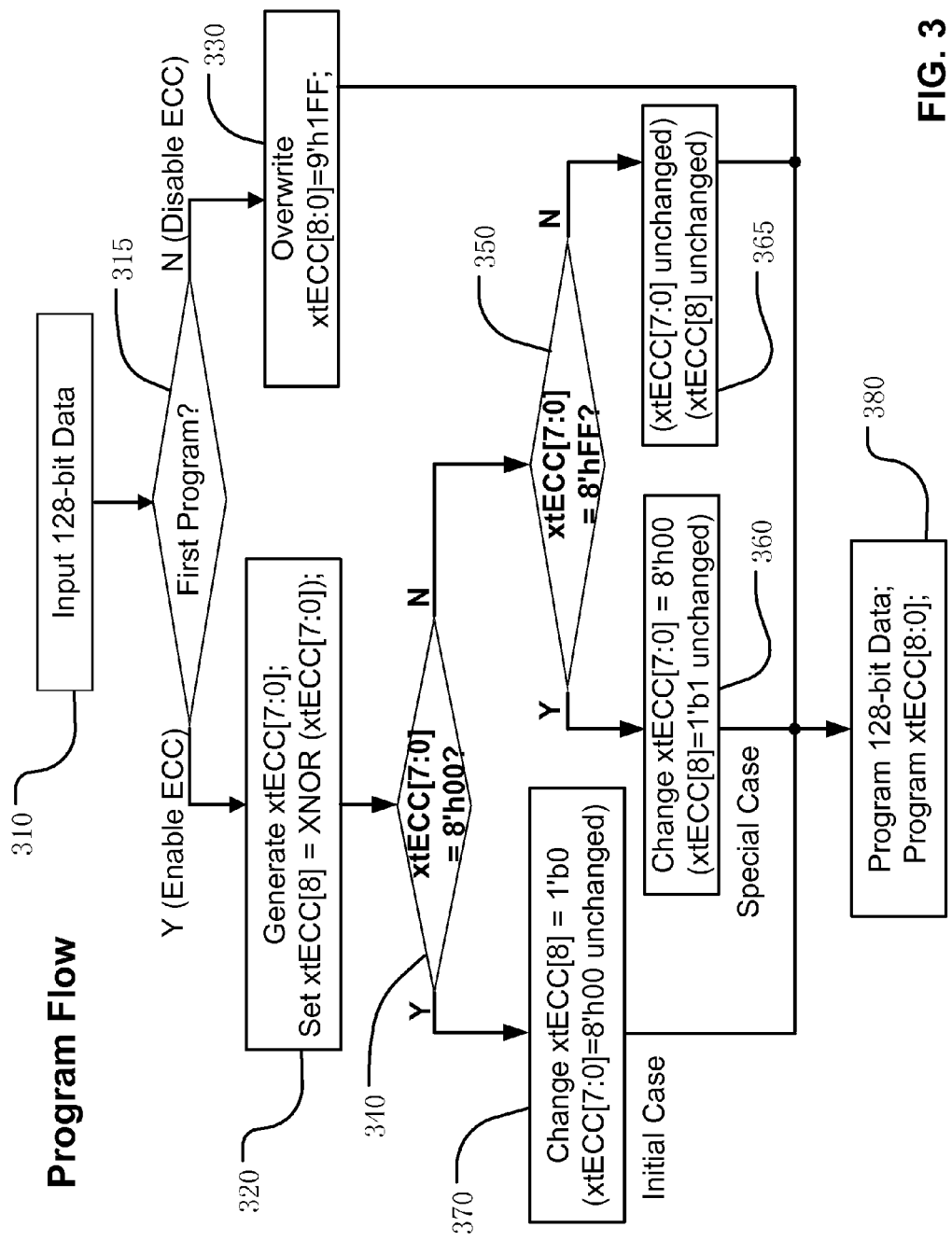
FIG. 3 is a flow chart for improved program operations as described in connection with FIG. 2.

FIG. 3 is a flow chart for improved program operations as described in connection with FIG. 2. At Step 310, data, such as 128-bit data, is available for programming in a page of data in the memory device using a program operation. At Step 315, it is determined whether the program operation for the data is a first program operation before any data is programmed in the page or a second program operation after the first program operation when at least some data was already programmed in the page. In other words, if the page does not have any programmed data in it, the program operation is a first program operation, otherwise if the second program can be executed without a pre-erase operation, then the program operation is a second program operation.

For the first program operation, at Step 320, an error correcting code ECC is computed for the data by ECC logic on the memory device using an ECC scheme. In the example illustrated in FIG. 3, the data has a length of 128 bits and the ECC for the data has 8 bits, as indicated by xtECC[7:0] in FIG. 3. In general, ECCs can have different numbers of bits for corresponding data of different lengths.

The ECC logic on the memory device can support any suitable ECC scheme. Representative ECC schemes include Hamming code, and extended Hamming code. The length of the error correcting code ECC associated with a particular data set depends on 3 factors: (1) ECC scheme; (2) Maximum corrected bit number; (3) Data length of one page.

At Step 320, after the error correcting code ECC (e.g. xtECC[7:0]) is computed, an extended bit xtECC[8] is derived from the xtECC[7:0]. The extended bit can be an odd parity bit, and is derived by executing a logical exclusive-NOR function on the ECC, such that the number of bits with the value '1' in xtECC[8:0] is odd. In a read operation described in connection with FIG. 4, the extended bit is utilized in determining whether to execute the ECC logic for error detection and correction.

During the second program operation, at Step 330, the extended ECC (e.g. xtECC[8:0]) including the extended bit (e.g. xtECC[8]) and the ECC (e.g. xtECC[7:0]) is overwritten with a pre-determined state (e.g. 9'h1FF) to indicate the second program operation. In a read operation described in connection with FIG. 4, the pre-determined state disables the ECC logic for error detection and correction on data programmed with the second program operation (Steps 450 and 404, FIG. 4).

During the first program operation, at Step 340, it is determined whether the ECC equals the initial ECC state (e.g. "xtECC[7:0]=8'h00") as described in connection with FIG. 2. If the ECC does not equal the initial ECC state, then at Step 350, it is further determined whether the ECC equals the pre-determined state (e.g. "xtECC[7:0]=8'hFF") indicating the second program operation.

If the ECC does not equal the initial ECC state and does not equal the pre-determined state (Step 340, N; Step 350, N), then at Step 365, the ECC (e.g. xtECC[7:0]) and the extended bit (e.g. xtECC[8]) are unchanged from results of Step 320. At Step 380, the data and the extended ECC (e.g. xtECC[8:0]) including the ECC are programmed in the memory device. As described in connection with FIG. 4, a read operation enables ECC for error detection and correction if there is no parity error and the ECC equals a value other than the pre-determined state and other than the initial ECC state (Steps 440, 450, and 405, FIG. 4). The read operation disables the ECC logic, if there is a parity error and the ECC includes values other than the initial ECC state (Steps 430 and 402, FIG. 4).

During the first program operation, a special case and an initial case can occur and are addressed herein. The special case occurs when a computed value for xtECC[7:0] equals the pre-determined state (e.g. '8'hFF') used to indicate the second program operation. At Step 360, if the computed value equals the pre-determined state (e.g. '8'hFF'), then the computed ECC value for the first program operation is changed, such as to the initial ECC state (e.g. "8'h00. The extended bit xtECC [8] is unchanged, as the odd parity bit is '1' for both values '8'hFF' and "8'h00". As described in connection with FIG. 4, a read operation can recognize the special case, change the ECC from the initial ECC state (e.g. "8'h00") back to the pre-determined state (e.g. '8'hFF'), and then enable ECC for error detection and correction on the corresponding data (Steps 440 and 403, FIG. 4).

If a computed value for the ECC equals the initial erased ECC state (e.g. "ECC[7:0]=8'h00") at Step 340, then the initial case occurs. In the initial case, the extended bit (e.g. xtECC[8]) for the initial ECC state "ECC[7:0]=8'h00" is '1'. Thus the extended ECC (e.g. xtECC[8:0]) after Step 340 has a value of 9'h100, corresponding to a value of the extended ECC after Step 360 for the special case, and thus may mistakenly indicate that the computed value corresponding to the initial ECC state (e.g. "ECC[7:0]=8'h00") should be changed to the pre-determined state (e.g. "8'hFF") in a read operation (Step 440 and 403, FIG. 4). To address the initial case, at Step 370, the extended bit (e.g. xtECC[8]) is changed to an initial value before the first program operation if the ECC equals the initial ECC state. As described for FIG. 2, the initial value for the extended bit is at a logical low state represented by a value '0'. Consequently, after Step 370, the nine bit extended ECC equals the initial eight bit ECC state and the initial one bit value for the extended bit (e.g. xtECC[8:0]=9'h000). In a read operation described in connection with FIG. 4, the ECC logic is enabled for the initial ECC state when no data is programmed in a page, and also for the initial case when a computed value for the ECC during the first program operation equals the initial ECC state (Steps 430 and 431, FIG. 4).

At Step 380, data and the extended ECC (e.g. xtECC[8:0]) for the data are programmed in the memory device, for either the first program operation or the second program operation.

Figure 4:
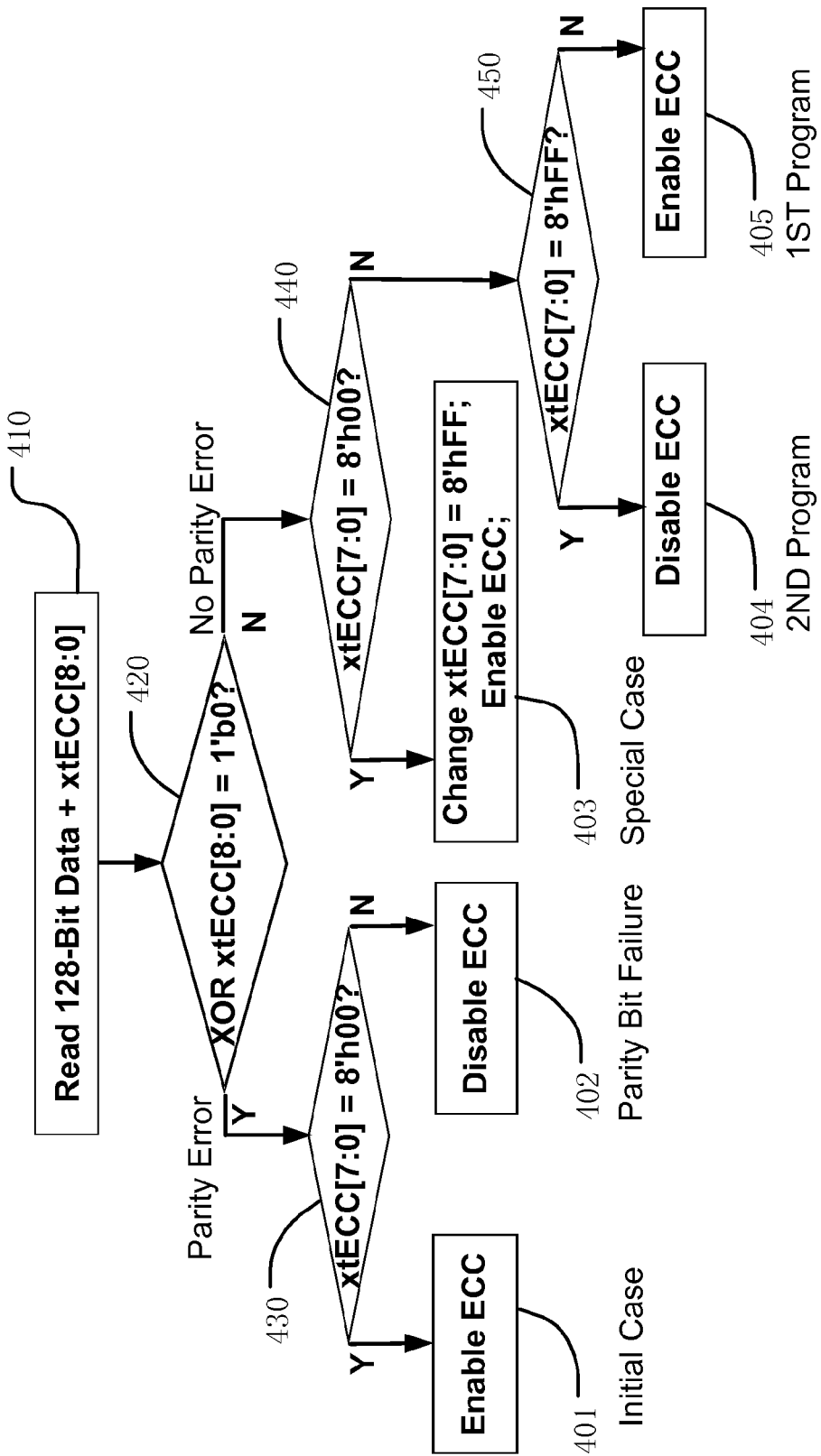
FIG. 4 is a flow chart for improved read operations as described in connection with FIG. 2.

FIG. 4 is a flow chart for improved read operations as described in connection with FIG. 2. At Step 410, data and an extended ECC (e.g. xtECC[8:0]) including an extended bit (e.g. xtECC[8]) and an ECC (e.g. xtECC[7:0]) for the data are read from the memory device, where the extended bit is derived from the ECC during a first program operation (Step 320, FIG. 3). At Step 420, parity is checked on the extended ECC (e.g. xtECC[8:0]) by executing a logical exclusive-OR function (XOR) on the extended ECC (e.g. xtECC[8:0]). If the extended ECC includes an even number of bits having a value '1', the XOR function returns "1'b0" to indicate a parity error. If the extended ECC includes an odd number of bits having a value '1', the XOR function returns "1'b1" to indicate no parity error. The rest of the flow chart determines whether to enable the ECC logic to detect and correct errors in the data using the extended ECC, depending on whether there is a parity error and on the value of the ECC (e.g. xtECC[7:0]).

At Step 430, it is determined whether the ECC equals an initial ECC state before a first program operation (e.g. xtECC [7:0]=8'h00). At Step 431, the ECC logic is enabled if a parity error is indicated and the ECC equals the initial ECC state before a first program operation (e.g. xtECC[7:0]=8'h00). The initial ECC state can exist before the first program operation, such as when the page of data is erased to prepare for the first program operation. The initial ECC state can also exist as a result of addressing the initial case, where the extended bit is changed to the initial value before the first program operation, as described for Step 370 in connection with FIG. 3.

At Step 432, the ECC logic is disabled, if a parity error is indicated and the ECC includes values other than the initial ECC state (e.g. xtECC[7:0]=8'h00). In other words, the ECC logic is disabled when there is a parity error on the extended ECC (e.g. xtECC[8:0]) and the ECC is not at the initial ECC state. Consequently, if the extended bit (e.g. xtECC[8]) as programmed during the first program operation is inverted due to parity bit failure, the parity check during the read operation prevents the error from mistakenly executing the ECC logic to change the data.

At Step 440, when no parity error is indicated, it is further determined whether the ECC is at the initial ECC state. At Step 403, if the ECC is at the initial ECC state (e.g. xtECC [7:0]=8'h00), then the ECC is changed to the pre-determined state (e.g. xtECC[7:0]=8'hFF). Step 403 reverses the action by Step 360 in the first program operation for the special case, as described in connection with FIG. 3. The ECC logic is subsequently enabled for error detection and correction, effectively using the original ECC as generated by Step 320 in the first program operation.

At Step 450, when no parity error is indicated, it is further determined whether the ECC is at the pre-determined state (e.g. xtECC[7:0]=8'hFF) indicating the second program operation. If yes, then at Step 404, the ECC logic is disabled to prevent error detection and correction on data programmed with the second program operation. If no, then at Step 405, the ECC logic is enabled for error detection and correction on data programmed with the first program operation.

FIG. 5 is a table illustrating how the improved program and read operations respond to failures in data and in extended ECC, where the extended ECC includes an ECC (e.g. xtECC [7:0] and an extended bit (e.g. xtECC[8]) derived from the ECC as a parity bit. The improved program and read operations using the parity bit improve over the scheme using an indication bit as described in connection with FIG. 1. Thus, if the parity bit is changed due to a retention error, the improved read operations can detect a parity error on the extended ECC, and prevent causing data errors by mistakenly enabling the ECC logic. Steps 401-405 in columns for "Data Failure", "xtECC[7:0] Failure", and "xtECC[8] Failure" correspond to Steps 401-405 in the read flow as illustrated in FIG. 4, respectively. FIG. 5 includes four scenarios with corresponding step numbers from FIG. 4 underlined. The four scenarios are explained below.

A Hamming code decoder (e.g. 660, FIG. 6) can detect and correct failures in data bits or in ECC bits corresponding to the data bits. In one implementation, failures can occur in 128 data bits (e.g. Data[127:0]) or in 8 ECC bits (e.g. xtECC[7:0]) corresponding to the 128 data bits. In this implementation, the Hamming code decoder has an output of 8 bits, and each value of the decoder output can indicate which bit to correct in the 128 data bits or in the 8 ECC bits. The table below illustrates example decoder output values with corresponding corrections in data bits or ECC bits. In particular, if the decoder output equals 8'b00000000 then there is no failure, and if the decoder output is greater than 8'b10001000, then no data bits or ECC bits are corrected.

| Decoder Output | Correction |
|---|---|
| 8'b00000000 | No failure. No correction. |
| 8'b00000001 | Correct xtECC[0] |
| 8'b00000010 | Correct xtECC[1] |
| 8'b00000100 | Correct xtECC[2] |
| 8'b00001000 | Correct xtECC[3] |
| 8'b00010000 | Correct xtECC[4] |
| 8'b00100000 | Correct xtECC[5] |
| 8'b01000000 | Correct xtECC[6] |
| 8'b10000000 | Correct xtECC[7] |
| 8'b00000011 | Correct Data[0] |
| 8'b10001000 | Correct Data[127] |
| 8'b10001001 to 8'b11111111 | No correction. |

On row 510, for the initial case, xtECC[7:0] is at the initial ECC state "00000000", which is also referred to as "8'h00" in hexadecimal notation. xtECC[8] has the initial value '0', which is also referred to as "1'b0" in hexadecimal notation. Consequently, Step 420 in FIG. 4 indicates a parity error, and the ECC logic is enabled for error detection and correction in accordance with Step 401. Thus, if a data failure occurs in data corresponding to xtECC[7:0], the data failure is corrected with Step 401, as shown in the "Data Failure" column on row 510.

Scenario 1 may occur if an xtECC[7:0] failure occurs at the initial case. A bit in the initial ECC state "00000000" may be inverted to a value '1', and thus Step 420 in FIG. 4 may mistakenly indicate no parity error. Since the failed xtECC[7:0] now has values other than the initial ECC state (e.g. 8'h00) and other than the pre-determined state indicating the second program operation (e.g. 8'hFF), the ECC logic is mistakenly enabled with Step 405, as shown in the "ECC[7:0] Failure" column on row 510.

Scenario 2 may occur if an extended bit failure occurs at the initial case. The extended bit xtECC[8] is inverted to a value '1', and thus Step 420 in FIG. 4 may indicate no parity error. Since the xtECC[7:0] equals the initial ECC state (e.g. 8'h00), the xtECC[7:0] is changed to the pre-determined state (e.g. 8'hFF) with Step 403. Step 403 also shows to enable the ECC logic. However, the decoder output in Scenario 2 equals 8'b11111111, which is greater than the value of 8'b10001000 as described above in the table. Consequently, no ECC correction is executed. Scenario 2 is shown as Step 403 in the "xtECC[8] Failure" column on row 510 in FIG. 5.

On row 520, for the special case, xtECC[7:0] equals the initial ECC state "00000000", which is also referred to as "8'h00" in hexadecimal notation. xtECC[8] has a value '1', which is also referred to as "1'b1" in hexadecimal notation. For reasons explained for the special case in connection with row 250 and row 260 in FIG. 2, the computed value for xtECC[7:0] in the special case is originally "11111111" or "8'hFF", and then changed to "00000000" or "8'h00". Consequently, Step 420 in FIG. 4 indicates no parity error, and the ECC logic is enabled for error detection and correction with Step 403. Thus, if a data failure occurs in data corresponding to xtECC[7:0], the data failure is corrected with Step 403, as shown in the "Data Failure" column on row 520.

If an xtECC[7:0] failure occurs at the special case, Step 420 in FIG. 4 may indicate a parity error. Since the failed xtECC[7:0] no longer equals the initial ECC state (e.g. 8'h00), the ECC logic is disabled with Step 402, as shown in the "ECC[7:0] Failure" column on row 520.

Scenario 3 may occur if an extended bit failure occurs at the special case. The extended bit xtECC[8] is inverted to a value '0', and thus Step 420 in FIG. 4 may indicate a parity error. Since the xtECC[7:0] equals the initial ECC state (e.g. 8'h00), FIG. 4 shows that the next step is Step 401 to enable the ECC logic. However, the decoder output in Scenario 3 equals 8'b11111111, which is greater than the value of 8'b10001000 as described above in the table. Consequently, no ECC correction is executed. Scenario 3 is shown as Step 401 in the "xtECC[8] Failure" column on row 520 in FIG. 5.

On row 530, for the second program operation, the extended ECC (e.g. ECC[8:0]) including the extended bit (e.g. xtECC[8]) and the ECC (e.g. xtECC[7:0]) is overwritten with a pre-determined state (ECC[8:0]=9'h1FF). In other words, xtECC[8] has the value '1', and xtECC[7:0] has the value "11111111". Consequently, Step 420 in FIG. 4 indicates no parity error, and the ECC logic is disabled for error detection and correction with Step 404, as shown in the "Data Failure" column on row 530. Thus, data programmed with the second program operation is prevented from being changed.

If an xtECC[7:0] failure occurs on data programmed with the second program operation, Step 420 in FIG. 4 may indicate a parity error. Since the failed xtECC[7:0] does not equal the initial ECC state (e.g. 8'h00), the ECC logic is disabled with Step 402, as shown in the "ECC[7:0] Failure" column on row 530.

If an extended bit failure occurs on data programmed with the second program operation, the extended bit xtECC[8] is inverted to a value '0', and thus Step 420 in FIG. 4 may indicate a parity error. Since the xtECC[7:0] does not equal the initial ECC state (e.g. 8'h00), the ECC logic is disabled with Step 402, as shown in the "xtECC[8] Failure" column on row 530.

For data programmed with the first program operation, the extended bit (e.g. xtECC[8]) has either a value '0' or a value '1'. Row 540 includes the xtECC[7:0] values that have exactly a single value '1', i.e., 8'b10000000, 8'b01000000, 8'b00100000, 8'b00010000, 8'b00001000, 8'b00000100, 8'b00000010, and 8'b00000001. Those values correspond to the values illustrated in the table above for the decoder output that indicate which ECC bit to correct. Row 550 includes the xtECC[7:0] values not included in other rows in FIG. 5. For an xtECC[7:0] value having exactly a single value '1', the corresponding extended bit (e.g. xtECC[8]) has a value '0' as shown in the xtECC[8] column for row 540. The extended bit of xtECC[7:0] for other cases on row 550 depend on xtECC[7:0] values of other cases. For example, the extended bit has a value '1' for an xtECC[7:0] value 8'b00001111.

If there is a data failure, whether the extended bit (e.g. xtECC[8]) has a value '0' or a value '1', if no parity error is detected and the xtECC[7:0] equals a value other than the pre-determined state and other than the initial ECC state, the ECC logic is enabled with Step 405, as shown in the "Data Failure" column on row 540 and row 550.

If an xtECC[7:0] failure occurs for data programmed with the first program operation, whether the extended bit (e.g. xtECC[8]) has a value '0' or a value '1', Step 420 in FIG. 4 may indicate a parity error. If the failed xtECC[7:0] does not equal the initial ECC state (e.g. 8'h00), the ECC logic is disabled with Step 402, as shown in the "ECC[7:0] Failure" column on row 540 and row 550.

Scenario 4 may occur if the extended bit (e.g. xtECC[8]) has a value '0', and the failed xtECC[7:0] equals the initial ECC state (e.g. 8'h00). For example, this failure can happen when xtECC[7:0] is changed from "10000000" to "00000000" due to a retention error. The ECC logic is mistakenly enabled with Step 401, as shown in the "ECC[7:0] Failure" column on row 540.

If an extended bit failure occurs for data programmed with the first program operation, whether the extended bit (e.g. xtECC[8]) has a value '0' or a value '1', Step 420 in FIG. 4 may indicate a parity error. If xtECC[7:0] does not equal the initial ECC state (e.g. 8'h00), the ECC logic is disabled with Step 402, as shown in the "xtECC[8] Failure" column on row 540 and row 550.

Figure 6:
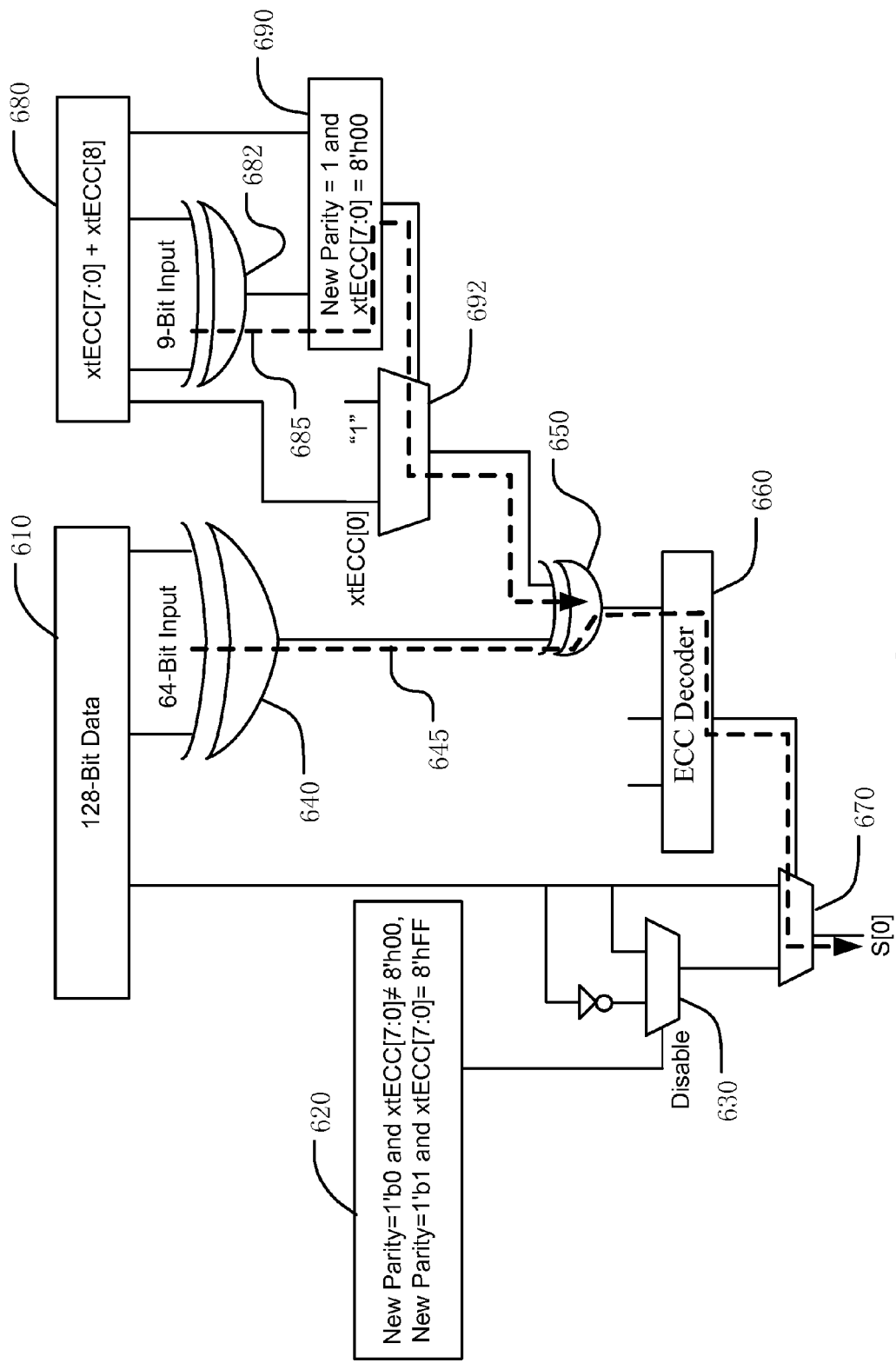
FIG. 6 is a schematic diagram illustrating a simplified implementation of improved read operations in one embodiment.

FIG. 6 is a schematic diagram illustrating a simplified implementation of improved read operations in one embodiment. In the example illustrated in FIG. 6, xtECC[7:0] refers to an error correcting code with 8 bits for corresponding data of 128 bits, although ECCs can have different numbers of bits for corresponding data of different lengths. Data in block 610 and an extended ECC (e.g. xtECC[8:0]) including an extended bit (e.g. xtECC[8]) and an ECC (e.g. xtECC[7:0]) in block 680 for the data are read from the memory device.

Implementation of the ECC logic for error detection and correction includes circuits along an ECC path (e.g. 645). Implementation of the improved read operations includes circuits along a parity path (e.g. 685) parallel to the ECC path. The ECC path (e.g. 645) includes a 64 input XOR gate (e.g. 640), a 2 input XOR gate (e.g. 650), an ECC decoder (e.g. 660), and a multiplexer (e.g. 670). The ECC path (e.g. 645) leads to ECC corrected data such as S[0] at an output of the multiplexer. The multiplexer (e.g. 670) is an example multiplexer representing other multiplexers (not shown) corresponding to the 128-bit data in block 610. S[0] is an example 1-bit data representing other data bits in 128-bit ECC corrected data corresponding to the 128-bit data in block 610.

The parity path (e.g. 685) includes a 9 input XOR gate (e.g. 682), a Block 690, and a multiplexer 692. The parity path joins the ECC path at the 2 input XOR gate (e.g. 650). The 9 input XOR gate 682 equals "XOR xtECC[8:0]" as used in decision block 420 in FIG. 4. "New parity" as used in Block 690 and Block 620 in FIG. 6 corresponds to the output of the 9 input XOR gate 682. Block 690 corresponds to decision block 440 in FIG. 4. The multiplexer 692 selects between a bit in xtECC[7:0], such as ECC[0], and a fixed logic value '1', depending on the output of the block 690. Selection of the fixed logic value '1' corresponds to block 403 in FIG. 4. Selection of a bit in xtECC[7:0] corresponds to block 405 in FIG. 4. The multiplexer 692 is an example of other multiplexers (not shown) for selection between other bits in xtECC[7:0] and the fixed logic value '1'. Block 620 generates a signal for disabling the ECC logic from the new parity and the ECC, and corresponds to Steps 402 and 404 in FIG. 4.

The logic in the 64 input XOR gate 640 in the ECC path 645 is more complex than the logic in the 9 input gate 682, the block 690, and the multiplexer 692 in the parity path 685. The logic in the parity path is more complex than the logic in Block 620. Consequently, timing delay through the ECC path is longer than timing delay through the parity path. Thus, the ECC path is the critical path, i.e., a path that limits the read speed during a read operation. Since the parity/extended bit (e.g. xtECC[8]) can be implemented in a manner that does not add extra timing delay to the critical path, the parity/extended bit does not adversely affect the read speed.

Figure 7:
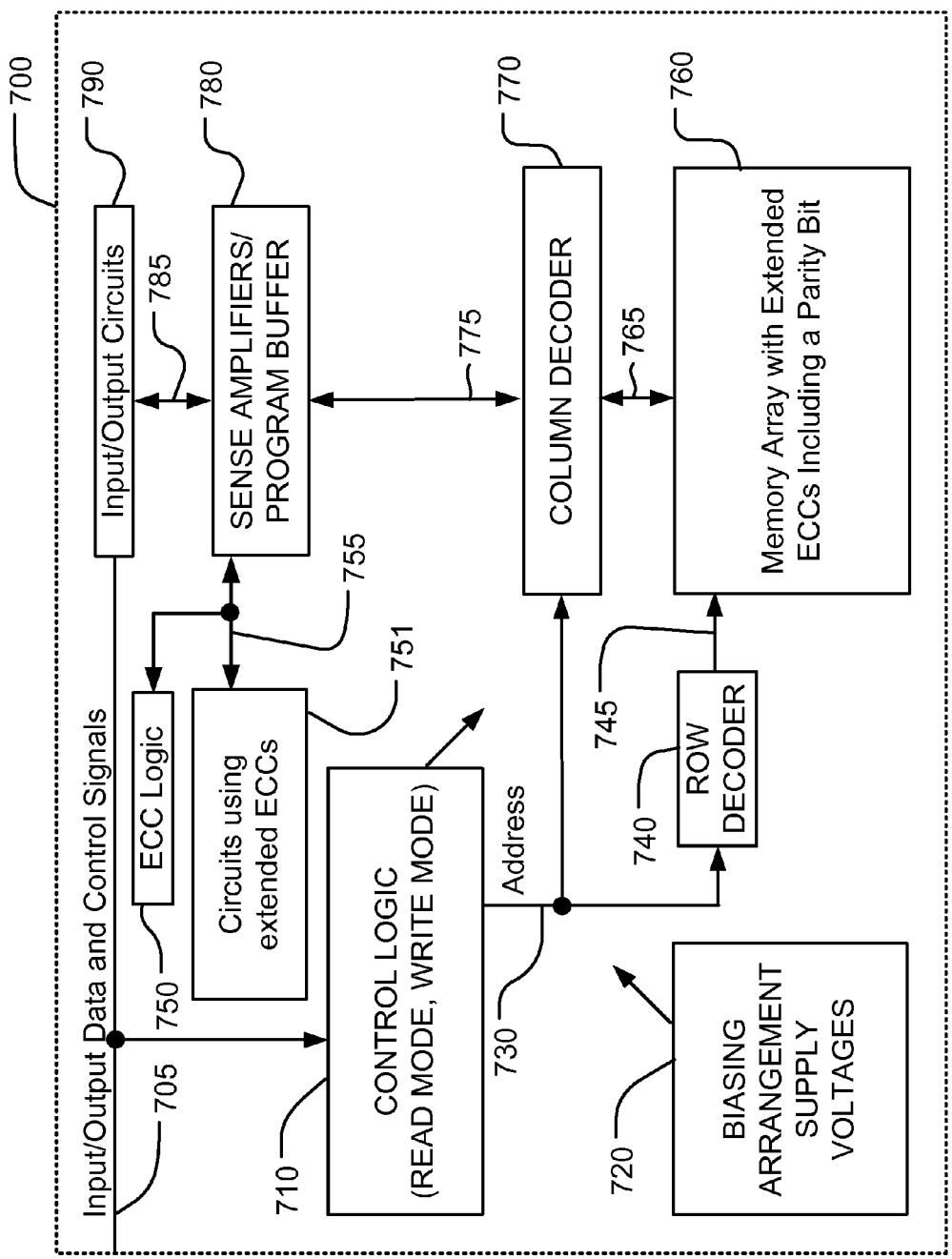
FIG. 7 is a simplified chip block diagram of an integrated circuit memory device according to an embodiment.

FIG. 7 is a simplified chip block diagram of an integrated circuit memory device 700 according to an embodiment. The integrated circuit 700 includes a memory array 760 that stores data with extended ECCs including a parity bit, on an integrated circuit substrate.

A row decoder 740 is coupled to a plurality of word lines 745, and arranged along rows in the memory array 760. A column decoder 770 is coupled to a plurality of bit lines 765 arranged along columns in the memory array 760 for reading data from and writing data to the memory array 760. Addresses are supplied on bus 730 from control logic 710 to column decoder 770, and row decoder 740. Sense amplifiers for read operations and a program buffer for write operations in block 780 are coupled to the column decoder 770, in this example via a first data bus 775, and coupled to input/output circuits 790, in this example via a second data bus 785. Input/output circuits 790 drive the data to destinations external to the integrated circuit 700. Input/output data and control signals are moved via data bus 705 between the input/output circuits 790, the control logic 710 and input/output ports on the integrated circuit 700 or other data sources internal or external to the integrated circuit 700, such as a general purpose processor or special purpose application circuitry, or a combination of modules providing system-on-a-chip functionality supported by the memory array 760.

In the example shown in FIG. 7, control logic 710 using a bias arrangement state machine controls the application of bias arrangement supply voltage generated or provided through the voltage supply or supplies in block 720, such as read and program voltages. The control logic 710 is coupled to the sense amplifiers and the program buffer in block 780, the ECC logic 750, and the memory array with extended ECCs 760. The ECC logic 750 and circuits using extended ECCs 751 communicate with the sense amplifiers and the program buffer in block 780 via signals 755.

For program operations, the memory device 700 includes circuits (e.g. 755) to write an extended ECC during a first program operation, where the extended ECC includes an ECC and an extended bit derived from the ECC, and to overwrite the extended ECC including the extended bit and the ECC with a pre-determined state during a second program operation after the first program operation to indicate the second program operation. The circuits can compute the ECC using Hamming codes. The extended bit can be derived by executing a logical exclusive-NOR function (XNOR) on the ECC. In one embodiment, each bit in the pre-determined state for the extended ECC has a logical high value. The circuits can set the ECC to an initial ECC state before the first program operation. The circuits can compute the ECC, and change the ECC to the initial ECC state before the first program operation if the computed ECC equals the pre-determined state, during the first program operation. In one embodiment, each bit in the initial ECC state has a logical low value. The circuits can change the extended bit to an initial value before the first program operation if the ECC equals the initial ECC state, during the first program operation. The initial value can have a logical low value.

For read operations, the circuits (e.g. 755) read an extended ECC including an extended bit and an ECC for corresponding data from the memory device, where the extended bit is derived from the ECC, and determine whether to enable ECC logic for error detection and correction on the corresponding data using the extended ECC. The circuits can perform a parity check on the extended ECC including the extended bit and the ECC to detect a parity error. The parity check can be performed by executing a logical exclusive-OR function on the extended ECC. The circuits can enable the ECC logic for error detection and correction, if a parity error is detected and the ECC equals an initial ECC state before a first program operation. The circuits can disable the ECC logic for error detection and correction, if parity error is detected and the ECC equals a value other than the initial ECC state. The circuits can change the ECC to a pre-determined state indicating a second program operation after the first program operation and then to enable the ECC logic for error detection and correction, if no parity error is detected and the ECC equals the initial ECC state. The circuits can disable the ECC logic for error detection and correction, if no parity error is detected and the ECC equals the pre-determined state. The circuits can further enable the ECC logic for error detection and correction, if no parity error is detected and the ECC equals a value other than the pre-determined state and other than the initial ECC state.

The control logic 710 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a memory device storing error correcting codes ECCs for corresponding data, comprising:
   writing an extended ECC for corresponding data during a first program operation, the extended ECC including an ECC and an extended bit derived from the ECC; and
   overwriting the extended ECC including the extended bit and the ECC for the corresponding data with a pre-determined state during a second program operation after the first program operation to indicate that the corresponding data is written with the second program operation.

2. The method of claim 1, including deriving the extended bit by executing a logical function on the ECC.

3. The method of claim 1, comprising:
   setting the ECC to an initial ECC state before the first program operation, and
   during the first program operation, computing the ECC, and changing the ECC to the initial ECC state before the first program operation if the computed ECC equals the pre-determined state.

4. The method of claim 3, comprising:
   during the first program operation, changing the extended bit to an initial value before the first program operation if the ECC equals the initial ECC state.

5. A method of operating a memory device storing error correcting codes ECCs for corresponding data, comprising:
   reading an extended ECC including an extended bit and an ECC for corresponding data from the memory device, wherein the extended bit is derived from the ECC; and
   determining whether to enable ECC logic on the corresponding data using the extended ECC.

6. The method of claim 5, comprising:
   performing a parity check on the extended ECC including the extended bit and the ECC to detect a parity error.

7. The method of claim 6, comprising performing the parity check by executing a logical function on the extended ECC.

8. The method of claim 6, comprising:
   enabling the ECC logic, if a parity error is detected and the ECC equals an initial ECC state before a first program operation; and
   disabling the ECC logic, if a parity error is detected and the ECC equals a value other than the initial ECC state.

9. The method of claim 8, comprising:
   changing the ECC to a pre-determined state indicating a second program operation after the first program operation and then enabling the ECC logic, if no parity error is detected and the ECC equals the initial ECC state.

10. The method of claim 9, comprising:
    disabling the ECC logic, if no parity error is detected and the ECC equals the pre-determined state; and
    enabling the ECC logic, if no parity error is detected and the ECC equals a value other than the pre-determined state and other than the initial ECC state.

11. A memory device comprising:
    a memory array storing data and error correcting codes ECCs for corresponding data;
    ECC logic to detect and correct errors in the corresponding data using the ECCs; and
    circuits configured to write an extended ECC for corresponding data during a first program operation, the extended ECC including an ECC and an extended bit derived from the ECC, and to overwrite the extended ECC including the extended bit and the ECC for the corresponding data with a pre-determined state during a second program operation after the first program operation to indicate that the corresponding data is written with the second program operation.

12. The memory device of claim 11, wherein the circuits are configured to derive the extended bit by executing a logical function on the ECC.

13. The memory device of claim 11, wherein the circuits are configured to set the ECC to an initial ECC state before the first program operation, and, during the first program operation, to compute the ECC, and to change the ECC to the initial ECC state before the first program operation if the computed ECC equals the pre-determined state.

14. The memory device of claim 13, wherein the circuits are further configured to change the extended bit to an initial value before the first program operation if the ECC equals the initial ECC state, during the first program operation.

15. The memory device of claim 11, wherein the circuits are further configured to:
    read an extended ECC including an extended bit and an ECC for corresponding data from the memory device, wherein the extended bit is derived from the ECC; and
    determine whether to enable ECC logic on the corresponding data using the extended ECC.

16. The memory device of claim 15, wherein the circuits are configured to perform a parity check on the extended ECC including the extended bit and the ECC to detect a parity error.

17. The memory device of claim 16, wherein the circuits are configured to perform the parity check by executing a logical function on the extended ECC.

18. The memory device of claim 16, wherein the circuits are configured to:
    enable the ECC logic, if a parity error is detected and the ECC equals an initial ECC state before a first program operation; and
    disable the ECC logic, if a parity error is detected and the ECC equals a value other than the initial ECC state.

19. The memory device of claim 18, wherein the circuits are configured to:
    change the ECC to a pre-determined state indicating a second program operation after the first program operation and then enable the ECC logic, if no parity error is detected and the ECC equals the initial ECC state.

20. The memory device of claim 19, wherein the circuits are configured to:
    disable the ECC logic, if no parity error is detected and the ECC equals the pre-determined state; and
    enable the ECC logic, if no parity error is detected and the ECC equals a value other than the pre-determined state and other than the initial ECC state.

\* \* \* \* \*